(12) United States Patent
Reil et al.

(10) Patent No.: US 10,896,860 B2
(45) Date of Patent: Jan. 19, 2021

(54) METHOD AND CURABLE COMPOUND FOR CASTING ELECTRONIC COMPONENTS OR COMPONENT GROUPS

(71) Applicant: ROBERT BOSCH GMBH, Stuttgart (DE)

(72) Inventors: Arno Reil, Lautertal (DE); Juergen Wieser, Ober-Ramstadt (DE); Jan Spengler, Erbach (DE); Roland Klein, Ober-Ramstadt (DE); Alexandra Kreickenbaum, Roßdorf (DE)

(73) Assignee: Robert Bosch GmbH, Stuttgart (DE)

( * ) Notice: Subject to any disclaimer, the term of this patent is extended or adjusted under 35 U.S.C. 154(b) by 83 days.

(21) Appl. No.: 16/315,265

(22) PCT Filed: Jul. 10, 2017

(86) PCT No.: PCT/EP2017/067210
§ 371 (c)(1),
(2) Date: Jan. 4, 2019

(87) PCT Pub. No.: WO2018/011116
PCT Pub. Date: Jan. 18, 2018

(65) Prior Publication Data
US 2019/0304861 A1 Oct. 3, 2019

(30) Foreign Application Priority Data

Jul. 11, 2016 (DE) .................. 10 2016 112 655
Feb. 23, 2017 (DE) .................. 10 2017 202 956

(51) Int. Cl.
*H01L 23/29* (2006.01)
*C08F 2/44* (2006.01)
(Continued)

(52) U.S. Cl.
CPC .............. *H01L 23/293* (2013.01); *C08F 2/44* (2013.01); *C08F 2/48* (2013.01);
(Continued)

(58) Field of Classification Search
None
See application file for complete search history.

(56) References Cited

U.S. PATENT DOCUMENTS 8,344,268 B2   1/2013  Tsujimura et al.
2019/0304861 A1*  10/2019  Reil .................... H01L 51/5253

FOREIGN PATENT DOCUMENTS

DE      19950538 A1     4/2001
DE    102008032330 A1   1/2010
(Continued)

OTHER PUBLICATIONS

International Search Report dated Nov. 10, 2017 in related application No. PCT/EP2017/067210.
(Continued)

*Primary Examiner* — Jack S Chen
(74) *Attorney, Agent, or Firm* — Norton Rose Fulbright US LLP; Gerard Messina (57) ABSTRACT

The present invention relates to a method for casting electronic components. The invention also relates to a curable compound that can be used as casting compound in the method. The casting compound contains at least one cross-linking component which is homogeneously distributed in the casting compound and can cross-link to at least two different cross-linked systems. A first of these networks has a higher cross-link density than a second cross-linked system, wherein the cross-linking to the first cross-linked system is triggered via an event other than the cross-linking to the second cross-linked system. During casting, the at least one cross-linking component of the casting compound
(Continued)

is cured at least in part to the first cross-linked system in at least one first region spaced from the components and at least to the second cross-linked system in a second region enclosing and immediately surrounding the components.

19 Claims, 4 Drawing Sheets

(51) Int. Cl.
  *C08F 2/48*     (2006.01)
  *C08F 222/10*    (2006.01)
  *C08K 5/00*     (2006.01)
  *C08K 5/07*     (2006.01)
  *C08K 5/132*     (2006.01)
  *C08K 5/1515*    (2006.01)
  *C08K 5/5397*    (2006.01)
  *H01B 3/30*     (2006.01)
  *H01L 21/56*     (2006.01)
  *H01L 23/31*     (2006.01)

(52) U.S. Cl.
  CPC ...... *C08F 222/1006* (2013.01); *C08K 5/0025* (2013.01); *C08K 5/07* (2013.01); *C08K 5/132* (2013.01); *C08K 5/1515* (2013.01); *C08K 5/5397* (2013.01); *H01B 3/302* (2013.01); *H01L 21/56* (2013.01); *H01L 23/3135* (2013.01)

(56) References Cited

FOREIGN PATENT DOCUMENTS

| | | | |
|---|---|---|---|
| DE | 102010010598 A1 | 9/2011 | |
| JP | H05160177 A | 6/1993 | |
| JP | H05 267507 A | 10/1993 | ............ H01L 23/29 |
| JP | H08125071 A | 5/1996 | |
| JP | H09 51009 A | 2/1997 | ............ H01L 21/56 |
| JP | 2001-223305 A | 8/2001 | ............ H01L 23/29 |
| JP | 2010034550 A | 2/2010 | |

OTHER PUBLICATIONS

Written Opinion dated Nov. 10, 2017 in related application No. PCT/EP2017/067210.

\* cited by examiner

METHOD AND CURABLE COMPOUND FOR CASTING ELECTRONIC COMPONENTS OR COMPONENT GROUPS

CROSS-REFERENCE TO RELATED APPLICATION

This is a § 371 application of International patent application number PCT/EP2017/067210 filed Jul. 10, 2017, which claims the benefit of German patent application numbers 10 2016 112 655.1 filed Jul. 11, 2016 and 10 2017 202 956.0 filed Feb. 23, 2017.

TECHNICAL AREA OF APPLICATION

The present invention relates to a method for casting electronic components or component groups, in which the components or the component group are embedded in a casting compound and the casting compound is then cured via at least one cross-linking process. The invention also relates to a curable compound which can be used as a casting compound for the method.

The casting of electronic components represents an important part in the production of modern electronic systems. However, the choice of the right casting compound currently requires a decision as to whether a softer or a more rigid casting compound must be used for casting the components.

Soft casting compounds are able to compensate for stresses that arise, for example, through shrinkage during curing or due to greatly different thermal expansion coefficients during temperature changes. However, they often do not provide adequate protection against external mechanical or chemical loads. The protection of the component against such loads must then be created by a separate housing. Though rigid casting compounds provide good protection of the electronics from chemicals and mechanical loads, they are less suitable for stress reduction than soft materials. In cast electronic components, mechanical stresses, which can damage the electrical component when using a rigid casting compound, are built up with temperature fluctuations due to the usually very different thermal expansion coefficients of the component and casting compound. In addition, the reaction shrinkage of rigid casting compounds is usually more pronounced. In the worst case, this can lead to the detachment of electronic components from the circuit board.

STATE OF THE ART

A casting compound should fulfill several functions in the field of electronics. It should completely encase the electronic components and protect against the penetration of moisture, dust, foreign bodies, water, chemicals, etc., in particular, to provide effective corrosion protection for the electronic components. The encasing should also ensure electrical isolation of the electronic components to increase electrical strength and contact protection. The casting compound should cause a fixation of the components with each other and increase the mechanical stability and the vibration and shock resistance of the cast electronic components. Furthermore, cavities should be filled by the casting compound and heat dissipation from the electronic components should be improved.

Known casting compounds in the electronics industry are predominantly reactive resin formulations. There are 1-component and 2-component systems, which usually have a good flowability (low viscosity) in order to be able to surround the component to be cast without bubbles. Commercially available casting compounds are produced, for example, based on polyurethanes, acrylates, unsaturated polyester resins, epoxy resins or silicones. Typically, these resin systems are cured via free-radical mechanisms or polyadditions. As a result, there is a scarcely manageable variety of different types on the market, which types are optimized for their respective purpose. Irrespective of the reactive resins or fillers used, all previously known casting compounds lead to uniformly cross-linked casting having homogeneous properties such as rigidity, shrinkage, expansion behavior, etc. In addition to cold and thermal curing types, UV-curing casting compounds are also available, which are characterized by very short curing times.

When casting electronic components or groups of components with the known casting compounds, however, a compromise must always be found between the above-mentioned advantages and disadvantages of harder and softer casting compounds. Here, there is the problem that a tightly cross-linked, rigid and hard casting compound on the one hand offers good mechanical protection and high chemical resistance, the dense cross-linked system, however, is associated with a high processing shrinkage, which together with the high rigidity leads to high mechanical residual stresses. This results in high, undesirable stresses on the sensitive, filigree electronic components. In particular, the fine-structured contacts on a circuit board are prone to stress-induced breakage and therefore do not allow the use of rigid casting compounds. Alternatively, partially elastomeric, soft casting compounds can be used, which have lower shrinkage and lower rigidity and thereby keep the resulting stresses small during curing or thermal cycling. However, these often do not provide satisfactory mechanical protection and can be swollen and permeated by chemical media. In a few exceptional cases, several different casting compounds are used in combination and poured into layers one above the other, which, however, leads to increased production risks and high costs, especially for quality assurance.

Both soft and hard casting compounds are usually used in the casting of electronic components or groups of components so that in addition, a separate metal or plastic housing surrounds the cast electronics. This housing is often used at the same time as a kind of casting mold, which is poured out with the casting compound. In this way, the electronics can be protected, for example, from a soft-curing casting compound against mechanical vibrations, etc., while the sealed housing protects the entire component from external mechanical influences or chemical attacks. However, this is associated with corresponding expenditure in production, is costly and naturally requires considerably more space than the electronic component itself.

The object of the present invention is to provide a method and a curable compound for casting electronic components or component groups with which the above disadvantages are substantially avoided when using soft or hard casting compounds. The method should also allow casting without an external housing for the cast component or the cast component group.

PRESENTATION OF THE INVENTION

The object is achieved with the method and the curable compound according to patent claims 1 and 8. Advantageous embodiments of the method and the curable compound are the subject of the dependent claims or can be found in the following description and the embodiments.

In the proposed method for casting electronic components or component groups, the component or the component group is embedded in a casting compound, which is then cured via at least one cross-linking process. The method is characterized in that a casting compound with a cross-linking component A is used for casting, which component is homogeneously distributed in the casting compound and can cross-link to at least two different cross-linked systems (networks), of which a first cross-linked system has a higher cross-link density than a second cross-linked system. The cross-linking to the first cross-linked system is triggered by an event other than the cross-linking to the second cross-linked system. In the proposed method, the at least one cross-linking component A of the casting compound is then at least in part cured to the first cross-linked system in at least one first region spaced from the electronic component or the electronic component group and cured to the second cross-linked system at least in a second region enclosing and immediately surrounding the electronic component or the electronic component group.

The method thus enables the casting of the components without the problems that occur when using soft or rigid casting compounds. In the contact region with the component or the component group, a softer region of the casting compound is produced by the lower cross-link density, by which mechanical stresses can be avoided which, for example, result from the different heat conduction behavior or from the reaction shrinkage of the casting compound. This leads to less mechanically loaded and thus more reliable components or component groups. At the same time, a higher rigidity is achieved in the first region having the higher cross-link density, by which a corresponding protective function can be exerted for the cast component or the cast component group. This first region can assume the function of a housing, so that in an advantageous embodiment of the method, the previously required working step of an additional housing can be saved by the corresponding cross-linking step of the casting compound in the first region. By thus possible dispensing with an external housing, the entire component having the cast electronic component or the cast electronic component group can be designed more compact and an increase in the integration density can thus be achieved. The proposed method thus enables the generation of a housing function out of the casting compound, while the interior of the casting compound remains soft. Thus, no compromise has to be made by choosing a softer or a more rigid casting compound. The method still uses only a single casting compound, which can be cured by combining different curing mechanisms to different cross-linked systems and thus locally different rigid regions.

Preferably, in this case, a casting compound is used, in which the first cross-linked system is formed by the at least one cross-linking component A alone and which contains at least one second component B, which is homogeneously distributed in the casting compound and with which the at least one cross-linking component A forms the second cross-linked system.

The cross-linking component A of the casting compound and the second component B are advantageously selected so that the two different cross-linked systems differ by at least a factor of 2 in the elasticity modulus. Preferably, the elasticity modulus of the harder or more rigid range is between 300 and 3000 MPa, more preferably between 500 and 2000 MPa. The elasticity modulus of the softer region is preferably between 0.5 and 200 MPa, more preferably between 1 and 100 MPa.

The locally limited curing of the at least one cross-linking component A of the casting compound preferably takes place completely in the first region, so that no non-cross-linking portions of the cross-linking component A remain in this region. However, this is not required. Surprisingly, it has been found that in the case of only partial curing or cross-linking to the first cross-linked system, the portions which are not yet cross-linked form the second cross-linked system in this region by triggering the second event by reaction with component B. Thus, through incomplete cross-linking of component A, it is also possible to generate regions whose cross-link density lies between that of the first cross-linked system and that of the second cross-linked system. In these regions, the elasticity moduli are also between those of the first cross-linked system and those of the second cross-linked system.

In the case of complete or partial cross-linking of the at least one cross-linking component A in the first region, there remain no or only reduced portions of component A with which component B could form the second cross-linked system. As a result, component B in these regions remains unreacted in the first cross-linked system after triggering of the second event. Surprisingly, it has been found that by addition of a component C which cannot react with component A but with component B, in regions in which component A is not present or only minimally present, excess portions of component B can be bound by formation of a further cross-linked system. In addition, component C can also react with bonds formed from the reaction of component A with component B, so that in all regions, irrespective of whether in one region a cross-linked system formation of component A triggered by the first event has taken place completely, partially or not at all, no unreacted components remain in the cured compound after the second event.

The casting of the component or the component group can be done in different ways in this case. In one embodiment, the electronic component or the electronic component group to be cast is introduced into an upwardly open housing and the casting compound subsequently filled into the housing in order to cast the electronic component or the electronic component group with, the casting compound. The curing is then carried out in such a way that the at least one cross-linking component A of the casting compound is cured in a lower region (second region) surrounding the component or the component group and is cured to the second cross-linked system in the region (first region) containing the upper boundary surface of the casting compound at least in part to the first cross-linked system. In the lower region, the casting compound thus has a lower cross-link density, while the upper closing region having the higher cross-link density is formed more rigidly and thus can serve as a closing part of the housing.

In a further embodiment, the entire component or the entire component group is cured to the first cross-linked system in a (first) region of the casting compound surrounding the second region and thus completely encloses the component including the softer (second) region of the casting compound. This enables a casting without casing, since the outer, more rigid region of the casting compound (first region) can completely assume the function of a housing in this case. This procedure can also advantageously be carried out in such a way that the casting compound is formed and cured during casting of the electronic component or the electronic component group so that the external shape of the cured casting compound approximates the contour of the electronic component or the electronic component group.

The electronic component or the electronic component group can thus be cast into a very compact component. The casting can be done in each case with the help of a casting mold or also without tools.

An advantageous possibility for tool-free casting of the component or the component group with the casting compound is to apply the casting compound with an additive manufacturing process in layers and to cure to the first and second cross-linked system layer by layer. The latter embodiment of the casting without casing can thus especially be realized very easily.

The curing mechanisms for the cross-linking of the component to be cross-linked to the first and second cross-linked system should be triggered as simply and inexpensively as possible. Preferably, the component A to be cross-linked and optionally one or more additives in the casting compound are selected so that the cross-linking component A cross-links to the first cross-linked system by radiation curing, for example, by UV radiation curing. This cross-linking can be carried out easily and inexpensively. For the cross-linking to the second cross-linked system, the component A to be cross-linked and, if appropriate, one or more additives in the casting compound are preferably selected such that the cross-linking to the second cross-linked system can be carried out with the technique of thermal curing. A variant of the method can be particularly easy to carry out with this combination of radiation curing and thermal curing, in which variant the at least one cross-linking component A of the casting compound is first cured to the first cross-linked system in the at least one first region and then to the second cross-linked system in remaining regions. Of course, other curing mechanisms can be found with which such a procedure is possible. For radiation curing, optical radiation is preferably used in a wavelength range between 100 nm and 700 nm, more preferably in a wavelength range between 250 nm and 450 nm. The heat treatment for thermal curing is preferably carried out in a temperature range between 60° C. and 300° C., more preferably between 110° C. and 180° C. In a preferred embodiment, the temperature during curing is increased in the thermal curing continuously or stepwise.

The implementation of the proposed method requires the use of a suitably composed casting compound having adjustable, locally controllable rigidity. For this purpose, the casting compound must contain at least one cross-linking component A which can cure to two differently dense cross-linked systems by two different curing mechanisms. Given the above conditions, it is readily possible for a person skilled in the art to produce suitable casting compounds which have these desired properties.

The curable compound proposed according to the invention, which can be used for the method described above, contains at least one cross-linking component A, which is homogeneously distributed in the curable compound and can cross-link to at least two different cross-linked systems, from which a first cross-linked system is formed alone by the at least one cross-linking component A, wherein at least partial cross-linking to the first cross-linked system can be triggered via a first event in at least one first region (i) of the curable compound. The curable compound also contains at least one second component B, which is homogeneously distributed in the curable compound and with which the at least one cross-linking component A can form a second of the at least two different cross-linked systems, which second cross-linked system has a lower cross-link density than the first cross-linked system. The cross-linking to the second cross-linked system in this case is triggered by a second event in at least one second region (ii) of the curable compound, in which the first cross-linked system has not or has only partially formed. The curable compound also still contains at least one third component C, which is homogeneously distributed in the curable compound and reacts to a further cross-linked system after the at least partial cross-linking to the first cross-linked system with not yet cross-linked portions of the at least one second component B in the first (i) and second region (ii). The reaction of the third component C with the second component B is thereby triggered by the second event.

In a preferred embodiment, the third component C is selected so that it can react in the at least one second region (ii), in which the first event was not triggered, also can react to the further cross-linked system with the cross-linking points arising from the reaction of the at least one component A with the at least one component B.

Preferably, the cross-linking component A, the second component B and the third component C are selected such that the first (i) and second region (ii) differ by at least a factor of 2 in the elasticity modulus after curing.

The at least one cross-linking component A is preferably a compound having at least two functional groups, in particular double bonds. Particularly preferred are compounds having at least two acrylate groups. Examples of such a component are esters of acrylic acid or methacrylic acid of higher alcohols such as ethylene glycol di(meth)acrylate, diethylene glycol di(meth)acrylate, triethylene glycol di(meth)acrylate, tetra- and polyethylene glycol di(meth)acrylate, 1,3-butanediol di(meth)acrylate, 1,4-butanediol di(meth)acrylate, 1,6-hexanediol di(meth)acrylate, 1,9-nonanediol dimethacrylate, glycerol di(meth)acrylate, diurethane dimethacrylate, trimethylolpropane tri(meth)acrylate, pentaerythritol tetraacrylate, dipentaerythritol pentaacrylate, 2,2-bis(4-methacryloxyphenyl) propane, 1,10-decanediol dimethacrylate, 1,5-pentanediol dimethacrylate, 1,4-phenylenediacrylate, tricyclodecanedimethanol dimethacrylate (available, for example, as SR833 from Sartomer/Arkema), tris(2-hydroxyethyl) isocyanurate triacrylate (available, for example, as SR368 from Sartomer/Arkema). Preferably, the curable compound contains at least one further component D which, by irradiation with visible or UV light, generates radicals which are capable of cross-linking the at least one cross-linking component A by a radical chain reaction. The person skilled in the art is able to find numerous such components, which are also referred to as photoinitiators, and fulfill this condition in the product catalogs, for example, of BASF, under the trade name Irgacure. Examples of this component D forming radicals by radiation are (2,4,6-trimethylbenzoyl)-phenylphosphine oxide, 1-hydroxy-cyclohexyl-phenyl-ketone, 2-hydroxy-2-methyl-1-phenyl-1-propanone, 2-hydroxy-1-{4-[4-(2-hydroxy-2-methylpropionyl)-benzyl]-phenyl}-2-methylpropan-1-one, 2-hydroxy-1-[4-(2-hydroxyethoxy)phenyl]-2-methyl-1-propanone, 2,4,6-trimethylbenzoyldiphenylphosphinate, 2,4,6-trimethylbenzoyldiphenylphosphine oxide, 2-methyl-1[4-(methylthio)phenyl]-2-morpholinopropan-1-one, 2-benzyl-2-dimethylamino-1-(4-morpholinophenyl)-butanone-1,2-dimethylamino-2-(4-methylbenzyl)-1-(4-morpholin-4-yl-phenyl)-butane-1-one or benzophenone.

The at least one second component B is preferably a compound having at least two functional groups, in particular a compound having at least two groups which can add itself to double bonds in a Michael addition, for example. These are, in particular, amine groups, thiol groups or phosphine groups. Particular preference is given to using compounds having at least two amine groups. The at least second component B is preferably selected from compounds having the general formula depicted below wherein R can be a hydrocarbon or other heteroatom-containing organic monomeric, oligomeric or polymeric compound, and which can be a linear or branched chain or a group consisting of one or more substituted or unsubstituted aliphatic or aromatic cyclic structures, in which hydrogen atoms are substituted by amine groups at least at two sites. Examples of these are ethylenediamine, diethylenetriamine, triethylenetetramine, isophoronediamine, 1,6-hexanediamine, toluenediamine, 4,4'-diphenylmethanediamine, 2,4'-diphenylmethanediamine, 1,3-diaminopentane, 2,2,4-trimethylhexane-1,6-diamine, 1,4-diaminobutane, polyethylene glycol diamine, polypropylene glycol diamine, or the commercial products Jeffamine D-400 or Jeffamine D-2000 from Huntsman or the hardeners Priamine 1071, Priamine 1073, Priamine 1074 or Priamine 1075 from Croda.

Preferably, the curable compound also contains at least one further component E, which catalyzes the reaction between the at least one cross-linking component A and the at least one second component B. Non-nucleophilic bases such as tertiary amines are preferably used for this purpose. Examples of this further component E are 1,8-diazabicyclo[5.4.0]undec-7-ene (DBU), 1,5-diazabicyclo[4.3.0]non-5-ene (DBN), triethylenediamine (DABCO), 4-(dimethylamino) pyridine (DMAP), N,N-diisopropylethylamine (DIPEA) or 2,6-di-tert-butylpyridine.

The at least one third component C is preferably a compound having at least two functional groups, in particular, epoxide functions. Examples of the component C are bisphenol A diglycidyl ether (DGEBA) and oligomers thereof, which are sold, for example, under the trade names Epilox A in different variants by Leuna-Harze, bisphenol F diglycidyl ethers and oligomers thereof, which, for example, are sold under the trade names Epilox F by Leuna-Harze, 1,4-butanediol diglycidyl ether, 1,6-hexanediol diglycidyl ether, trimethylolpropane triglycidyl ether, 1,3-bis(2,3-epoxypropoxy)-2,2-dimethylpropane, 1,2-epoxy-3-(2-methylphenoxy) propane, 1,4-bis(2,3-epoxypropyloxy) butane, cyclohexane dimethanol diglycidyl ether, glycerol tricycyl ether, neopentyl glycol diglycidyl ether, pentaerythritol polyglycidyl ether, polyethylene glycol diglycidyl ether, polypropylene glycol diglycidyl ether or epoxidized vegetable fats.

In an advantageous embodiment, the mixing ratio among the components A, B and C is selected so that after the occurrence of the first and the second event in the at least one of the first region (i), at least 99% of the components A, B and C are incorporated into at least one of the formed cross-linked systems and at most 1% of functional groups of the components A, B and C remain and that after the sole occurrence of the second event in the at least one second region (ii), at least 99% of the components A, B and C are incorporated in the second cross-linked system and at most 1% of functional groups of components A, B and C remain.

The curable compound can also contain at least one filler or reinforcing agent in a portion of between 1 and 99% by weight, preferably between 20 and 80% by weight and more preferably between 40 and 70% by weight.

The curing of the proposed curable compound is preferably done such that in at least one region of the compound which is to obtain a higher cross-link density than at least one other region, the first event that forms the first cross-linked system is triggered, and the second event that forms the second cross-linked system is triggered over the entire volume.

The following are examples of curable compounds that are suitable for use in the proposed method.

With the proposed method and the proposed curable compound, the dilemma of choosing between a hard and a soft casting compound can be avoided in the field of electronics by combining the advantages of both variants. With the method, it is also possible to realize a casting without casing of electronic systems, such as semiconductor elements, sensors, control electronics, power electronics, etc., with the variable-curing casting compound in which the hard outer layer assumes the function of a housing. This can also be done completely without tools in additive manufacturing processes such as stereolithography. The electronic components can be equally used in many domains such as in the automotive industry, in white goods or even in consumer electronics.

BRIEF DESCRIPTION OF THE DRAWINGS

The proposed method and the proposed curable compound are explained in more detail below with reference to exemplary embodiments in conjunction with the drawings. Shown are.

WAYS TO CARRY OUT THE INVENTION

Figure 1:
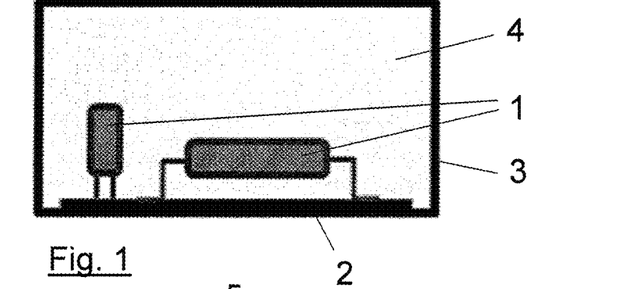
FIG. 1 an example of cast components according to the prior art.

The following figures show different possibilities for casting electronic components with a casting compound. The conventional method according to the prior art is shown in FIG. 1, in which the electronic components 1 are inserted on a circuit board 2 into a housing 3 and then cast in the housing 3 with a relatively soft curing casting compound 4. The housing 3 is then completely closed with a housing cover.

In the method according to the invention, a casting compound is used which, depending on the curing mechanism used for curing, for example, radiation curing or thermal curing, can cure to cross-linked systems of different rigidity or density. This enables, via the choice and local application of the respective curing mechanism, setting locally different rigidities of the casting compound. With the proposed method, the electronic components can then be enclosed by a soft core material of the casting compound, which simultaneously forms a rigid outer layer. In this way, the stresses in the core region can be mitigated and thus avoid damage to the electronics. At the same time, the housing function or at least part of the housing function can be realized by the rigid outer layer of the cured casting compound.

Figure 2:
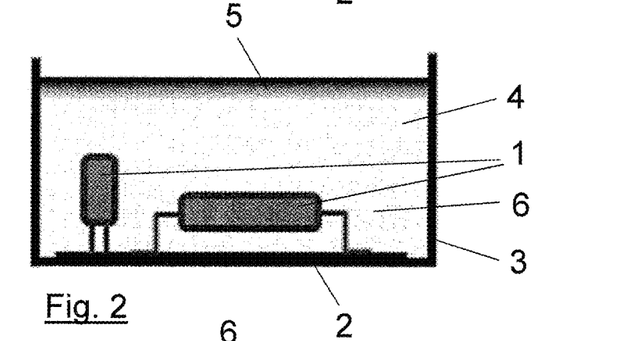
FIG. 2 an example of components cast in accordance with the proposed method.

For example, FIG. 2 shows an example according to the invention, in which the electronic components 1 on a circuit board 2 are first inserted into an upwardly open housing 3. The casting compound 4 is then filled into the housing and cured to a first, denser cross-linked system in the upper first region 5 with a first curing mechanism. In the second region 6, which encloses the electrical components 1 directly, the casting compound 4 is cured to a second cross-linked system with a lower cross-link density with a second curing mechanism. Due to the higher cross-link density in the upper region 5, the cured casting compound is significantly more rigid in this region than in the inner core region, that is, the second region 6 with the second cross-linked system, so that the function of the housing cover can be assumed by this first region 5. An additional component for closing the housing as in the embodiment of FIG. 1 is not required for this purpose.

Figure 3:
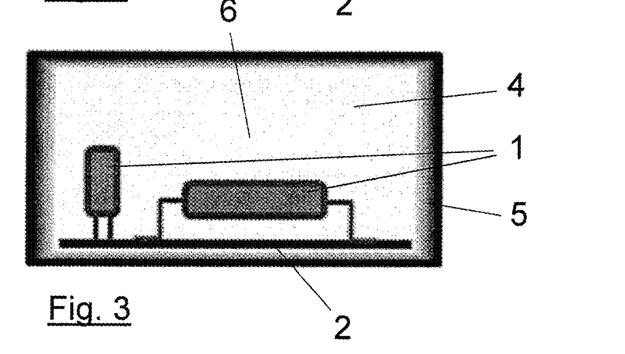
FIG. 3 a further example of components cast in accordance with the present method.

The proposed method can completely dispense with a separate housing, as is schematically indicated in the example of FIG. 3. Here, the electronic components 1 on the circuit board 2 are completely enclosed by the second (softer) region 6 of the casting compound 4. This second region 6 is in turn completely encased by the first (more rigid) region 5 of the casting compound 4. This first region 5 here assumes the function of a housing which protects the electronic components 1 against ingress of moisture, dust, foreign bodies, water, chemicals, etc. Such a configuration can be done by casting into a suitable casting mold, which is then removed. A further possibility is the use of an additive manufacturing process in which the casting compound 4 is applied layer by layer and cured in order to completely encase the electronic components 1 on the circuit board 2 accordingly. As a result, a casting of the electronic components is possible without tools or casing. In this additive manufacturing process, the curing is carried out in layers, that is, in each case after the application of the respective layer.

Figure 4:
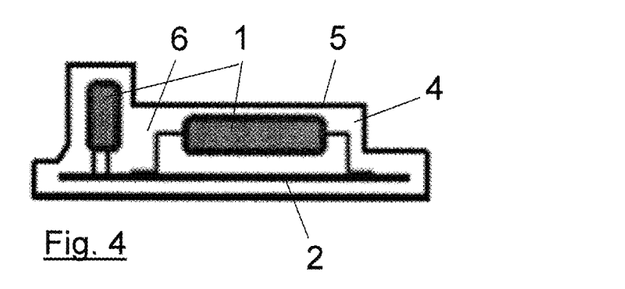
FIG. 4 a further example of components cast in accordance with the present method.

With such an additive production technique, there is also the possibility of casting the electronic components 1 on the circuit board 2 close to the contour, as is indicated schematically in FIG. 4. With the proposed method and the gradient casting compound used therein, a contour close casting of electronic components or component groups is thus possible without tools or casing.

Figure 5:
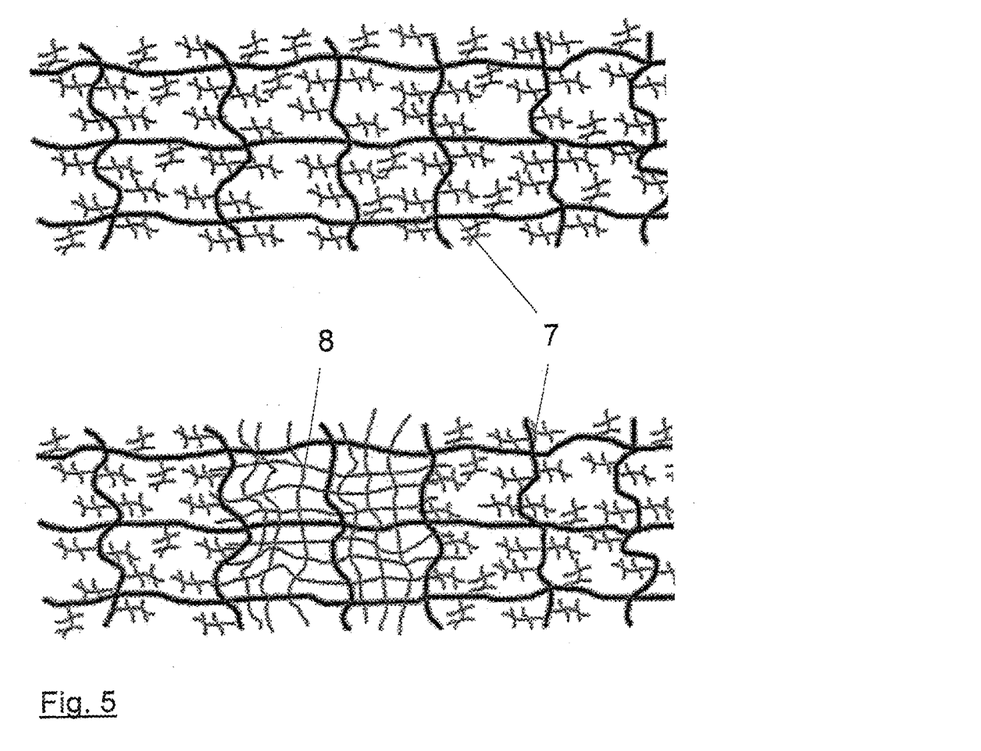
FIG. 5 a schematic representation of the differently dense cross-linked systems used in the proposed method.

In the proposed method, a curable compound is used as a casting compound, which can be cured by means of different curing mechanisms to differently rigid cross-linked systems. Various options and material combinations are available to the person skilled in the art for the development or provision of such a compound. The following example produces a curable compound in which a curing mechanism (second curing mechanism) acts over the entire volume of the compound and generates a wide-meshed cross-linked system having low cross-link density. The resulting material is then soft to rubber-elastic. The further curing or cross-linking mechanism (first curing mechanism) acts locally, for example, only at the surface, and generates a high cross-link density, by which a more rigid material is obtained. This is shown schematically in FIG. 5. In the upper partial image, a cross-linked system 7 having low cross-link density is shown, which can be generated by the second curing mechanism, which encompasses the entire volume and leads to an elastomeric material. In the lower partial image, a region having a higher cross-link density 8 can be detected locally within the cross-linked system 7 of the upper partial image, which is achieved by a locally acting first curing mechanism and leads to a rigid material. The cross-linking component A of the curable compound and the two curing mechanisms are selected so that the second curing mechanism encompasses the entire volume of the curable compound, while the first curing mechanism acts only locally. By combining these two curing mechanisms, the cross-link density of the curable compound and thus its rigidity can be controlled in a targeted manner.

The preparation of such a compound is to ensure that both mechanisms lead to a stable final state. After curing, no significant portions of reactive groups which can cause post-cross-linking of the compound may remain in the soft region and in the rigid region. Complete curing of all components is the prerequisite for long-term stability at changing temperatures. The functional groups necessary for increasing the cross-link density should, for example, locally work off in the first curing step and be incorporated into the wide-meshed cross-linked system in the second curing step. However, no increase in cross-link density or rigidity is allowed in this case. Therefore, the at least one substance used as cross-linking component A must be able to form cross-linked systems in two different ways.

Figure 6:
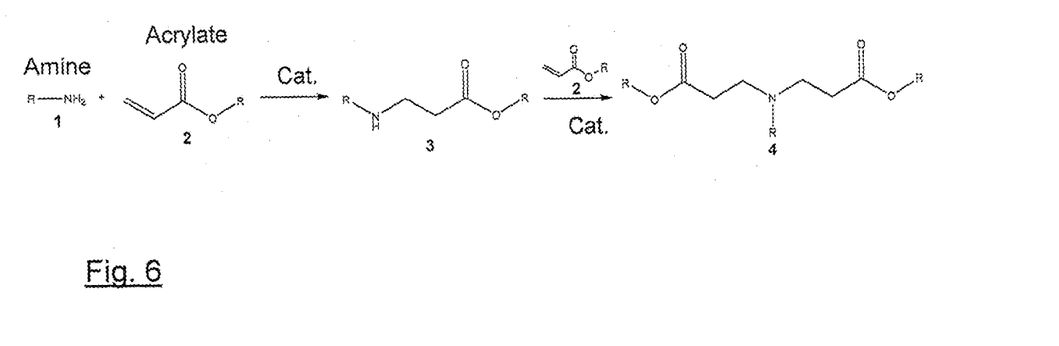
FIG. 6 a schematic representation of the base-catalyzed aza-Michael addition of amines to acrylates.

An example of suitable base materials of such a curable compound is the class of acrylates as cross-linking component A, which acrylates have manifold possibilities of cross-linked system formation. The simplest way is radical polymerization, which can be initiated thermally or by UV radiation in the presence of a radical former. Acrylates can also be polymerized anionically or cationically. A further mechanism for curing acrylates is Michael addition. This enables the base-catalyzed addition of amines to the C—C double bond of the acrylate, as exemplified in FIG. 6. This variant has advantages for the proposed method, since the acrylate, unlike radical polymerization, is not directly linked with other acrylate groups but rather via amine hardeners as the second component B. This means that the cross-link density in this type of polymerization can be controlled by the type of the amine hardener and thus differs significantly from the cross-link density of radical polymerization. When using long-chain flexibilizing amine hardeners in combination with acrylates which, as homopolymers, form highly rigid materials having a high $T_g$ ($T_g$: glass transition temperature), soft materials can be produced with elastomeric character. The Michael addition of amines to acrylates thus represents a preferred mechanism which fulfills the conditions described above. However, the proposed method is neither limited to acrylates nor the above mechanisms, since a person skilled in the art can find other base materials and mechanisms at any time that fulfill the conditions for the proposed method.

In the present example, the radical polymerization of the acrylates is selected as the mechanism by which the production of the rigid material can be triggered locally. This is not activated thermally, but rather by UV treatment with a suitable photoinitiator. In particular, this variant offers significant advantages in the application of a casting compound for casting electronic components without casing proposed here. The radiation curing allows the targeted triggering of the radical acrylate polymerization in the outer regions of the curable compound and thus the production of a solid outer skin, which can later assume the housing function. At the same time, the penetration depth of the UV radiation and thus the thickness of the solid outer layer can be controlled both via the radiation intensity or duration and via the type of the photoinitiator or possible fillers.

In order to combine the radical polymerization of acrylates and the Michael addition of amines to acrylates in a formulation of a curable compound having adjustable mechanical properties, consequently, an acrylate resin (component A), which has a very high rigidity and strength as a homopolymer, and a suitable photoinitiator (component D) is required. For the Michael addition, on the other hand, flexibilizing amine hardeners (component B) are needed to produce a material having elastomeric character and a non-nucleophilic strong base catalyst (component E). In the irradiated regions, the acrylate reacts with itself and with the amine hardeners in the non-irradiated regions. The acrylate is thus completely used up both in the soft and in the rigid region and can no longer be post-cross-linked. After the formation of a rigid material by UV treatment, the unreacted amine hardener remains in the cross-linked system. These represent no danger in terms of a possible post-cross-linking. However, in a preferred embodiment, they can also be bound in the cross-linked system in order to avoid washing out of these components and thus, as a result, a change in the material properties over time. This can be done, for example, via an epoxy resin as a further component C.

The number of commercially available polyfunctional acrylates is large and includes, for example, the products SR834, SR833S and SR368 from Sartomer/Arkema, and some types from the VISIOMER series from Evonik. The selection of amine hardeners is also very large and therefore includes a variety of compounds. Examples are the hardeners DETA, TETA, 2,2,4-trimethylhexane-1,6-diamine, IPDA or 1,4-diaminobutane from Sigma-Aldrich, the hardeners Jeffamine D-400 or Jeffamine D-2000 from Huntsman or the hardeners Priamine 1071, Priamine 1073, Priamine 1074 or Priamine 1075 from Croda.

If a second resin component is to be used in order to bind the unreacted amine hardener in the cross-linked system as described above, various epoxides from Leuna-Harz and Ipox-Chemicals, for example, which can react with the residual amines after irradiation, can be used. For example, the products Epilox P 13-20, Epilox P 13-26, Epilox P 13-42, Epilox P 13-30 or DGEBA from Leuna-Harz and the product IPOX ER 15 from Ipox-Chemicals can be used for this purpose. For example, suitable photoinitiators, accelerators and catalysts that can be used are Irgacure 184 or Irgacure 819 from BASF as photoinitiators for radical polymerization of the acrylates, Accelerator 960-1 from Huntsman as an accelerator for aminic epoxy curing and diazabicyclononene (DBN), diazabicycloundecene (DBU), triazabicyclodecene (TBD), triethylenediamine (DABCO) from Sigma-Aldrich as non-nucleophilic bases as a catalyst for the Michael addition.

The main component of the casting compound or curable compound selected in the present example is the acrylate, preferably SR833S, SR368 and mixtures of the two. With increasing portion of foreign components or additives (amines, epoxide, initiator, base catalyst), the UV curing is increasingly hindered, which can lead to a decrease in rigidity or strength in the exposed region. A ratio of 0.5 to 0.65 g of foreign components per 1 g of acrylate is particularly advantageous in this case. The foreign components are composed of a large portion of different amines, a small portion of epoxide and a very small portion of initiator/catalyst/accelerator. The components were combined and then mixed with a Speedmixer™ DAC400.1 VAC-P from Hauschild (1:30 min, 2500 rpm, 20 mbar) to obtain the desired curable compound.

For tests, test pieces for tensile tests were prepared from the curable compound. For this purpose, the curable compound was filled in silicone molds in tension rod form. To obtain a soft material, the unexposed samples were aged at different curing temperatures. In order to obtain a rigid material, the samples were first irradiated in the UV irradiation chamber (UVA-CUBE 2000, Hoehnle, 2000 W, 15 cm distance from the tube) and then aged in the oven. The curing temperatures and durations are given in the following examples. The samples prepared in this way were then subjected to a tensile test, tested for Shore A hardness and examined for glass transition temperatures by DSC (Dynamic Differential Scanning calorimetry) and DMA (Dynamic Mechanical Analysis) to illustrate differences in mechanical and thermal properties. For this purpose, three examples from a large number of experimental series are shown in the following.

Example 1

In the first example, SR368 serves as an acrylate component. Amino-terminated polyethers of different chain length (Jeffamine D-400 and D-2000) and IPDA serve as amine components. The formulation is mixed with the cycloaliphatic IPDX ER 15 as an epoxy resin for binding the amine hardener. DBU was used to catalyze the Michael addition. Irgacure 819 serves as photoinitiators for the production of tensile samples having a thickness of 2 mm and Irgacure 184 serves for experiments on the penetration depth of the radiation. The formulation of a curable compound thus prepared has the composition specified in the following table.

| Component | Amount |
| --- | --- |
| SR368 | 5 g |
| IPOX ER 15 | 0.5 g |
| Jeffamine D-2000 | 1 g |
| Jeffamine D-400 | 0.7 g |
| IPDA | 0.85 g |
| Irgacure 184 or 819 | 10 mg |
| DBU | 50 mg |

After filling the test piece molds, half of the samples were irradiated for two minutes in the UVA-CUBE 2000, while the other half was protected from light irradiation. Subsequently, all samples were cured together for two hours at 110° C. and one hour at 180° C. in the oven. Already after irradiation, the previously transparent test pieces are opaque, which indicates a phase separation between the polymerized acrylate and the epoxide or the amine hardeners. This is advantageous since the acrylate phase polymerized in this way should retain the physical and mechanical properties of the homopolymer, that is, a high glass transition temperature $T_g$ and a high rigidity. The exclusively thermally cured samples retain their transparency. It thus forms a homogeneous cross-linked system. A rigid, hard material was formed in the exposed region and a soft, rubber-elastic material in the unexposed region. The measurement results of the tensile test are shown in the stress-strain diagram of FIG. 7 and the following table.

Figure 7:
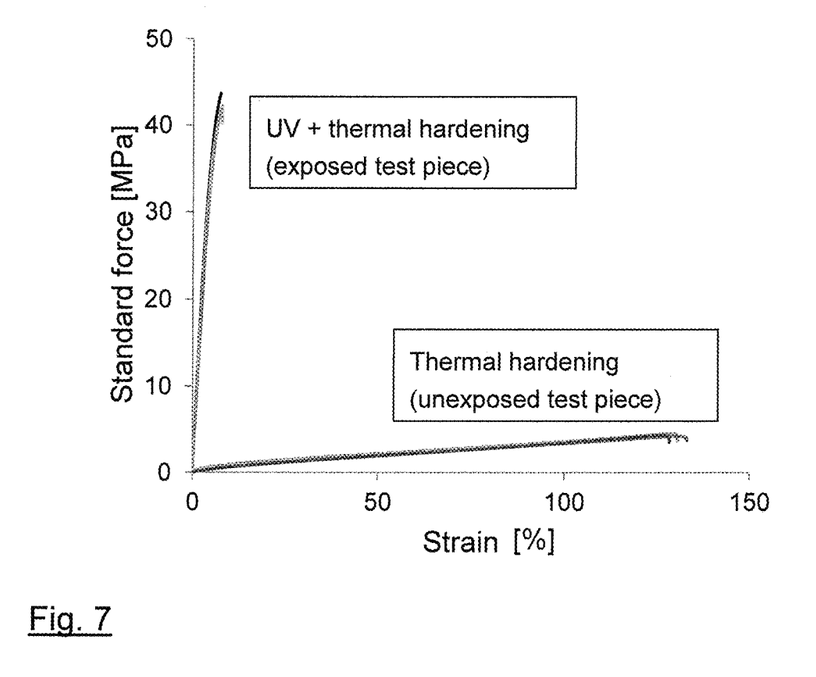
FIG. 7 a stress-strain diagram of the test pieces of the first example.

| Tensile tests | | | | | |
|---|---|---|---|---|---|
| Test piece | E-Modulus [MPa] | $\sigma_B$ [MPa] | $\varepsilon_B$ [%] | Shore hardness A | DSC $T_g$ [° C.] | DMA $T_g$ [° C.] |
| Rigid | 850.1 | 41.7 | 7.6 | 46 | — | 132.1 |
| Soft | 21.3 | 3.6 | 130.7 | 76 | 10.7 | — |

The figure clearly shows the high rigidity of the test pieces by UV and thermal curing, while the test pieces with purely thermal curing have a high elasticity. The purely thermally cured compound behaves similar to an elastomer, with extremely low rigidity and high extensibility. However, if the compound is first irradiated, the rigidity increases enormously at the expense of extensibility. The condition regarding a stable gradient is also fulfilled by this exemplary formulation. For this purpose, the test pieces were examined in the DSC for post-reactions. Neither in the soft nor in the rigid sample were post-reactions detected in the temperature range between −75° C. and 200° C. The reactive groups in both types of samples are therefore completely consumed, so that a permanent rigidity difference can be generated by the irradiation.

Figure 8:
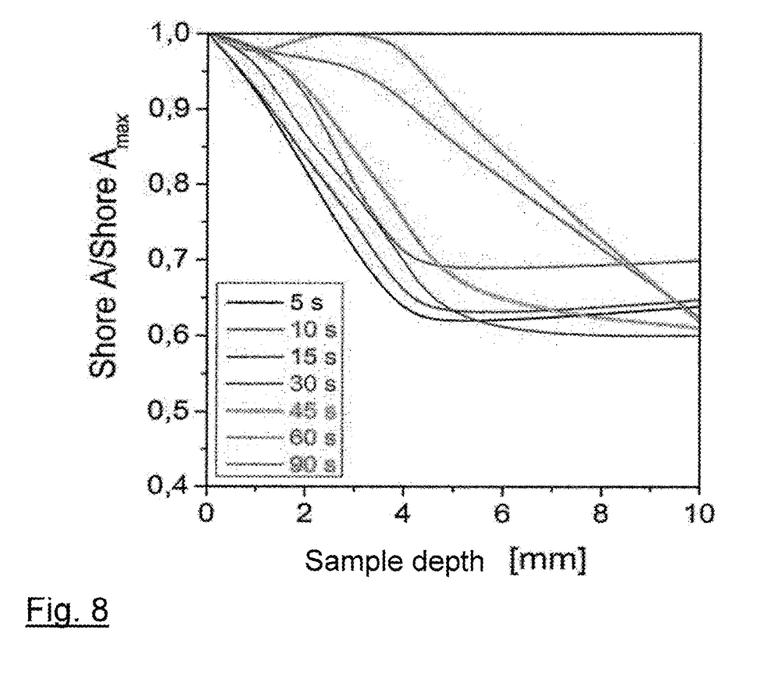
FIG. 8 a diagram showing the course of the Shore hardness A as a function of the sample depth.

To check whether this type of formulation is suitable for casting of electronic components without casing, the photoinitiator Irgacure 819 was replaced by Irgacure 184. Irgacure 819 already disintegrates by irradiation at wavelengths which are in the visible region of the spectrum and is therefore suitable for curing thicker layers. Irgacure 184, on the other hand, has an absorption maximum at wavelengths around 250 nm, that is, exactly within the range in which absorption of the resin systems used can be expected. This is to ensure that the penetration depth of the radiation in the relevant wavelength range is kept as low as possible in order to generate in this way a thin, rigid edge layer, which can later assume the housing function. In order to investigate the influence of the irradiation duration on the penetration depth of the UV radiation when using Irgacure 184, polystyrene cuvettes were wrapped with black insulating tape and filled with 3 g each of the formulation listed above. Subsequently, the samples were exposed for different lengths of UV radiation and then thermally cured according to the above heating program. FIG. 8 shows the course of the surface hardness as a function of the sample depth at different irradiation durations.

As can be seen from FIG. 8, the penetration depth of the UV radiation increases with increasing irradiation duration. From a duration of approx. 60 s, a saturation value of approx. 4 mm penetration depth has been reached. The surface hardness of the sample decreases at the transition from the rigid to the soft region. After just a few millimeters under the rigid layer, a 30-40% lower Shore hardness than in the rigid region is shown. This experiment shows that the layer thickness of the outer rigid layer, which is later to assume the housing function, can be adjusted in a targeted manner via the type of photoinitiator and the irradiation duration.

Example 2

SR368 and SR833S serve as acrylate components in the second example. Polyethers of different chain length (Jeffamine D-400 and D-2000) and IPDA serve as amine components. The formulation DGEBA is mixed as an epoxy resin to bind the amine hardener. DBU is used to catalyze the Michael addition. Irgacure 819 serves as a photoinitiator. The following formulation of the curable compound is developed from these ingredients:

| Component | Amount |
|---|---|
| SR368 | 1 g |
| SR833S | 4 g |
| DGEBA | 0.5 g |
| Jeffamine D-2000 | 1 g |
| Jeffamine D-400 | 0.7 g |
| IPDA | 0.85 g |
| Irgacure 819 | 10 mg |
| DBU | 50 mg |

After filling the test piece molds, half of the samples was irradiated for 5 minutes in the UVA-CUBE 2000, while the other half was protected from light irradiation. Subsequently, all samples were oven-cured for 2 hours at 110° C. and 2 hours at 180° C. Here, rigid, transparent test pieces were obtained in the exposed region, and consequently no phase separation was achieved. The acrylate SR833S led to better mixing and integration of the unreacted components after irradiation. The transparency here is not a sign of a lower rigidity, which is evidenced by the measurement results shown in FIG. 9 and the following table. FIG. 9 again here shows the measurement results of the tensile test sample in a stress-strain diagram.

Figure 9:
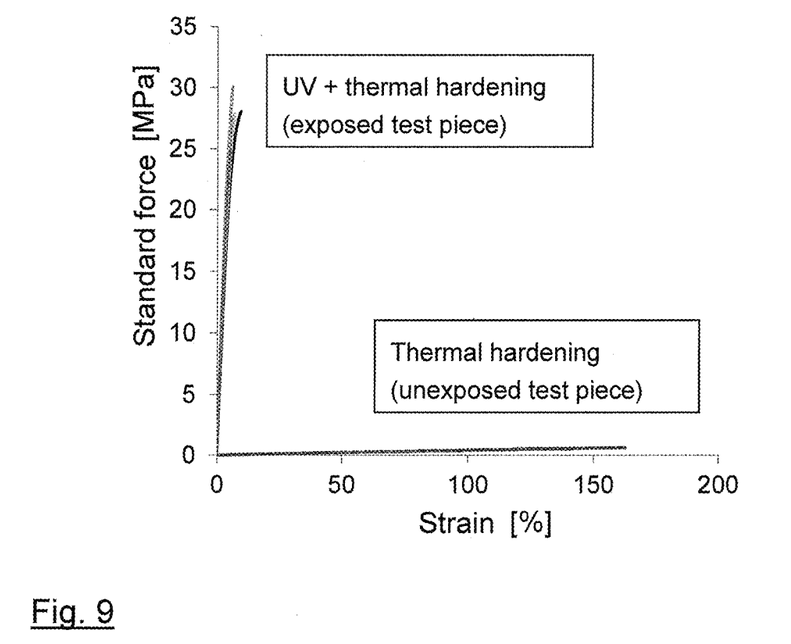
FIG. 9 a stress-strain diagram of the test pieces of the second example.

| Tensile tests | | | | | |
|---|---|---|---|---|---|
| Test piece | E-Modulus [MPa] | $\sigma_B$ [MPa] | $\varepsilon_B$ [%] | Shore hardness A | DSC $T_g$ [° C.] | DMA $T_g$ [° C.] |
| Rigid | 606.7 | 26.8 | 7.2 | 10 | — | 116.5 |
| Soft | 0.7 | 0.5 | 144.1 | 70 | −5.4 | — |

This formulation provides an even softer material in the unexposed region than in Example 1, which can be seen from the lower values for glass temperature, Shore hardness A and E-modulus. The exposed test pieces also have lower rigidity or strength after curing, which is sufficient for a housing function. The big advantage of the combination of SR368 and SR833S is the reduction in viscosity with increasing portion of SR833S. Depending on the portion of SR833S, the viscosity of the overall mixture can be controlled, which can be advantageous for the use of fillers in terms of shrinkage and thermal conductivity. The use of the second photoinitiator Irgacure 184 to investigate the penetration depth in this formulation leads to a very similar result as in Example 1, wherein it was no longer possible to differentiate visually between the rigid and the soft region. The rigidity of the exposed outer layer can also be adjusted in this formulation via the type of initiator and the exposure duration. No post-reactions in the range of −75° C. and 200° C. were observed, that is, the curing was complete and all reactive groups are consumed.

Example 3

SR833S serves as an acrylate component in the third example. The priamines (a mixture of aminated monomers, dimers and trimers of oleic acid; aliphatic backbone) and 2,2,4-trimethylhexane-1,6-diamine serve as amine components. The formulation DGEBA is mixed as an epoxy resin to bind the amine hardener. DBU is used to catalyze the Michael addition. Irgacure 819 serves as the photoinitiator.

The following formulation of the curable compound is developed from these ingredients:

| Component | Amount |
|---|---|
| SR833S | 5 g |
| DGEBA | 0.75 g |
| Priamine 1075 | 0.74 g |
| 2,2,4-trimethylhexane-1,6-diamine | 1.26 g |
| Irgacure 819 | 10 mg |
| DBU | 50 mg |

Figure 10:
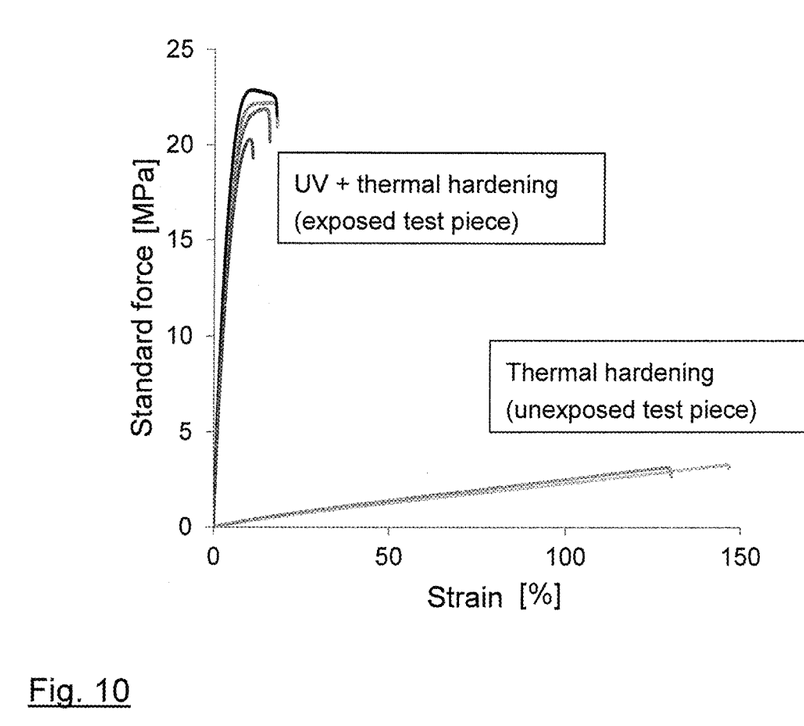
FIG. 10 a stress-strain diagram of the test pieces of the third example.

After filling the test piece molds, half of the samples was irradiated for 5 minutes in the UVA-CUBE 2000, while the other half had to be protected from light irradiation. Subsequently, all samples were oven-cured for 2 hours at 110° C., 2.5 hours at 150° C., and 1 hour at 180° C. Again, only transparent test pieces are obtained here, that is, the excess amines/epoxides are miscible with the acrylate cross-linked system and there is no phase separation. The measurement results of the tensile test pieces are shown in FIG. 10 and the following table.

| | Tensile tests | | | | | |
|---|---|---|---|---|---|---|
| Test piece | E-Modulus [MPa] | $\sigma_B$ [MPa] | $\varepsilon_B$ [%] | Shore hardness A | DSC $T_g$ [° C.] | DMA $T_g$ [° C.] |
| Rigid | 566 | 20.5 | 15.6 | 24 | 27.1 and 185.2 | — |
| Soft | 4.2 | 2.9 | 138.6 | 74 | 12.1 | — |

Again, a significant difference in rigidity is achieved here and thus enables use as a casting compound in the proposed method. The benefit of the amines having aliphatic backbone (priamines and 2,2,4-trimethylhexane-1,6-diamine) used here is higher temperature stability of the cured materials. Soft and rigid parts of the casting compound retain their properties even after prolonged storage at elevated temperatures, which represents a clear advantage compared to Example 1 and 2. An application above 100° C. could be feasible with this formulation. Here, too, no post-cross-linking in the range −50° C. to 250° C. was observed, which speaks for a complete conversion of all components. The layer thickness of the rigid outer layer can also be controlled here via the exposure duration.

Although some of the previously proposed compounds are not listed in the examples shown, however, they can also be used in corresponding formulations for the proposed method and the proposed curable compound. These compounds all have some effect on curing and can be used for modification. For example, the acrylate SR834 and the bases DBN or DABCO serve to slow down the curing reactions in comparison to the examples given above, wherein the other compounds are usually suitable for accelerating the reactions. The rigidity and strength of both regions can be changed by using some epoxies, which also represents an important adjusting screw. All compounds have their own usefulness in the developed formulations and can therefore also be used according to the invention independently of the examples shown here.

In summary, it can be stated that such formulations can be used as a casting compound or a curable compound having variable mechanical properties. The rigidity of the compound can be selectively controlled and in particular generated locally through irradiation with UV or visible light. At the same time, it could be shown in Example 1 that the penetration depth of the relevant radiation (layer thickness of the rigid region) can be controlled via the type of photoinitiator and the irradiation intensity and duration. Thus, a type of housing function can be generated by irradiation, while the interior of the compound remains soft and the electronics is encased with as little stress as possible. A condition for an application is a complete curing of all components of the curable compound, wherein the basic component preferably locally cross-links in the temporally first curing step (for example, UV; first curing mechanism) and should be incorporated in the subsequently carried out second curing step (for example, thermally; second curing mechanism) without rigidity increase in the wide-mesh cross-linked system. This condition can be fulfilled, for example, with a combination of light-induced acrylate cross-linking and base-catalyzed Michael addition. Of course, the person skilled in the art will readily be able to find other mechanisms and/or components or formulations of curable compounds that fulfill the above conditions.

The developed formulations should preferably be selected so that the shrinkage generated during curing and the associated stresses are minimal. In addition, electronic components usually generate heat that must be dissipated. At this point, the use of fillers may be beneficial. In the electronics sector, usually only electrically insulating, but thermally conductive fillers are useful. These include, for example, quartz, aluminum compounds (oxide, hydroxide, boehmite, nitride), boron nitride and silicon carbide. Numerous experiments with the mentioned fillers showed a significant shrinkage reduction and an increase in the thermal conductivity at filler contents above 60% by weight. The maximum processing viscosity of casting compounds is 1000-10000 mPa*s, which should be achieved even with high practical filling levels with the formulations proposed here.

In the proposed method, two materials completely different with respect to their thermal and mechanical properties are produced from one and the same formulation of a curable compound. Housings for electronic components can thus be realized in which a soft phase has a clear glass transition at low temperatures, whereas in the rigid phase, glass transition temperatures of, for example, about 110° C. can be achieved. In terms of surface hardness and rigidity, significantly different properties are thereby achieved. The method thus allows the casting of electronic components or component groups with a housing function out of the casting compound, while the interior of the casting compound remains soft. This housing function can be generated in a particular embodiment by a short irradiation step in the range of seconds.

LIST OF REFERENCE NUMBERS 1 electronic component
2 circuit board
3 housing
4 casting compound
5 first region
6 second region
7 cross-linked system having low cross-link density
8 cross-linked system having high cross-link density

The invention claimed is:
1. A method for casting electronic components or component groups, in which the component or the component group is embedded in a casting compound which is cured via at least one cross-linking process, wherein:

a casting compound is used which contains at least one cross-linking component A, which is homogeneously distributed in the casting compound and can cross-link to form at least two different cross-linked systems, of which a first system is formed by the at least one cross-linking component A alone, an at least partial cross-linking to form the first system is triggered by a first event in at least a first region of the casting compound, the casting compound contains at least one second component B, which is homogeneously distributed in the casting compound and with which the at least one cross-linking component A can form a second of the at least two different systems, which has a lower cross-link density than the first system, the cross-linking to form the second system can be triggered by a second event in at least one second region of the casting compound, in which the first system has not been formed or has only been partially formed, the casting compound contains at least one third component C, which is homogeneously distributed in the casting compound and, after the at least partial cross-linking to form the first system, reacts with not yet cross-linked components of the at least one second component B in the first region and the second region to form a further system, a reaction of the third component C with the second component B is triggered by the second event, the at least one cross-linking component A of the casting compound is at least partially cured to form the first system in at least one region kept at a distance from a first electronic component or an electronic component group, and is cured to form the second system at least in a region enclosing and directly surrounding the electronic component or the electronic component group, as a second region.

2. The method according to claim 1, wherein the at least one cross-linking component A and the at least one second component B are selected so that the two different cross-linked systems differ by at least a factor of 2 in the elasticity modulus.

3. The method according to claim 1, wherein the electronic component or the electronic component group to be cast is introduced into an upwardly open housing and the casting compound is subsequently filled into the housing in order to cast the electronic component or the electronic component group with the casting compound, wherein the at least one cross-linking component A of the casting compound is at least in part cured to the first cross-linked system in a region containing an upper boundary surface of the casting compound as the first region and is cured to the second system at least in the remaining region as the second region.

4. The method according to one of claim 1, wherein the cross-linking component A is cured in a layer of the casting compound as the first region to the first cross-linked system, which layer forms an outer boundary surface of the casting compound and completely encloses the second region with the electronic component or the electronic component group.

5. The method according to claim 4, wherein the casting compound during casting of the electronic component or the electronic component group is shaped and cured so that an outer shape of the cured casting compound approximates a contour of the electronic component or the electronic component group.

6. The method according to claim 1, wherein the casting compound is applied in layers and cured with an additive manufacturing process during the casting of the electronic component or the electronic component group.

7. The method according to claim 1, wherein in at least one region of the compound to receive a higher cross-link density than at least one other region, the first event that forms the first system is triggered, and the second event which forms the second system is triggered over an entire volume of the compound.

8. A curable compound which can be used as a casting compound for the method according to claim 1 and which contains at least one cross-linking component A which is homogeneously distributed in the curable compound and can cross-link to at least two different cross-linked systems, of which a first cross-linked system is formed by the at least one cross-linking component A alone, wherein an at least partial cross-linking to the first cross-linked system is triggerable via a first event in at least one first region (i) of the curable compound, contains at least one second component B which is homogeneously distributed in the curable compound and with which the at least one cross-linking component A can form a second of the at least two different cross-linked systems, which has a lower cross-link density than the first cross-linked system wherein the cross-linking to the second cross-linked system is triggerable via a second event in at least one second region (ii) of the curable compound, in which the first cross-linked system was not or was only partially formed, and contains at least one third component C, which is homogeneously distributed in the curable compound and after the at least partial cross-linking to the first cross-linked system, reacts with not yet cross-linked portions of the at least one second component B in the first (i) and second region (ii) to a further cross-linked system, wherein the reaction of the third component C with the second component B is triggered by the second event.

9. The curable compound according to claim 8, characterized in that the cross-linking component A, the second component B and the third component C are selected so that the first (i) and second region (ii) differ by at least a factor of 2 in the elasticity modulus.

10. The curable compound according to claim 8, characterized in that the first event is a treatment with visible or UV light.

11. The curable compound according to claim 8, characterized in that the second event is a heat treatment.

12. The curable compound according to claim 8, characterized in that the at least one cross-linking component A is a compound having at least two functional groups, in particular double bonds.

13. The curable compound according to claim 8, characterized in that it contains at least one further component D, which generates radicals by irradiation with visible or UV light, which radicals are capable of cross-linking at least one cross-linking component A by radical chain reaction.

14. The curable compound according to claim 13, characterized in that the at least one component D forming radicals by irradiation is bis(2,4,6-trimethylbenzoyl)-phenylphosphine oxide, 1-hydroxycyclohexyl-phenyl-ketone or benzophenone.

15. The curable compound according to claim 8, characterized in that the at least one second component B is a compound having at least two functional groups, in particular a compound having at least two amine groups.

16. The curable compound according to claim 15, characterized in that it contains a further component E, which catalyzes the reaction between the at least one cross-linking component A and the at least one second component B.

17. The curable compound according to claim 8, characterized in that the at least one third component C is a compound having at least two functional groups, in particular epoxide functions.

18. The curable compound according to claim 8, characterized in that a mixing ratio between the components A, B and C is selected so that after the occurrence of the first and the second event, at least 99% of components A, B and C are incorporated in at least one of the forming cross-linked systems in the at least one first region (i) and at most 1% of functional groups of components A, B and C remain and that after the sole occurrence of the second event, at least 99% of components A, B and C are incorporated in the second cross-linked system in the at least one second region (ii) and at most 1% of functional groups of components A, B and C remain.

19. The curable compound according to claim 8, characterized in that the curable compound contains at least one filler or reinforcing agent in a portion of 1 to 99% by weight.

\* \* \* \* \*